(12) United States Patent
Puura et al.

(10) Patent No.: US 10,260,343 B2
(45) Date of Patent: Apr. 16, 2019

(54) MINE CONTROL SYSTEM (71) Applicant: SANDVIK MINING AND CONSTRUCTION OY, Tampere (FI)

(72) Inventors: Jussi Puura, Tampere (FI); Tomi Von Essen, Tampere (FI)

(73) Assignee: SANDVIK MINING AND CONSTRUCTION OY, Tampere (FI)

( * ) Notice: Subject to any disclaimer, the term of this patent is extended or adjusted under 35 U.S.C. 154(b) by 0 days.

(21) Appl. No.: 15/111,290

(22) PCT Filed: Jan. 14, 2015

(86) PCT No.: PCT/EP2015/050567
§ 371 (c)(1),
(2) Date: Jul. 13, 2016

(87) PCT Pub. No.: WO2015/107070
PCT Pub. Date: Jul. 23, 2015

(65) Prior Publication Data
US 2016/0333690 A1 Nov. 17, 2016

(30) Foreign Application Priority Data
Jan. 14, 2014 (WO) .................. PCT/EP2014/050598

(51) Int. Cl.
*E21C 41/16* (2006.01)
*E21C 35/24* (2006.01)
(Continued)

(52) U.S. Cl.
CPC .............. *E21C 35/24* (2013.01); *E21B 7/025* (2013.01); *E21C 1/00* (2013.01); *E21C 41/16* (2013.01); *E21D 9/003* (2013.01); *E21D 9/004* (2013.01); *G01C 7/06* (2013.01); *G01S 7/4808* (2013.01); *G01S 7/4865* (2013.01); *G01S 17/42* (2013.01); *G01S 17/89* (2013.01); *G05D 1/024* (2013.01);
(Continued)

(58) Field of Classification Search
CPC ....... E21D 20/003; E21D 9/003; E21D 9/004; E21C 35/24; E21C 1/00; E21C 41/16; G06F 17/50; G05D 1/0251; G05D 1/024; G05D 1/0274; G05D 2201/021; G01S 17/42; G01S 17/89; G01S 7/4808; G01S 7/4865; G01C 7/06; E21B 44/00; E21B 7/025
See application file for complete search history.

(56) References Cited

U.S. PATENT DOCUMENTS

| 2003/0052529 A1* | 3/2003 | Hakkinen | E21C 35/24 299/1.05 |
| 2005/0283294 A1 | 12/2005 | Lehman et al. | |
| 2009/0202109 A1 | 8/2009 | Clar et al. | |

FOREIGN PATENT DOCUMENTS

| CN | 101208494 A | 6/2008 |
| CN | 101946250 A | 1/2011 |

(Continued)

*Primary Examiner* — Carib A Oquendo
(74) *Attorney, Agent, or Firm* — Corinne R. Gorski (57) ABSTRACT

A mine control system for monitoring mine operations includes a plurality of mine vehicles provided with on-board monitoring means. Monitoring data is transmitted from the mine vehicle to the mine control system, which is provided with a mine plan. The mine control unit is configured to compare the received monitoring data with the mine plan and to determine the current state of the mine relative to the mine plan on the basis of the monitoring data.

7 Claims, 7 Drawing Sheets

(51) Int. Cl.
- *E21D 9/00* (2006.01)
- *E21B 7/02* (2006.01)
- *G01C 7/06* (2006.01)
- *G01S 17/42* (2006.01)
- *G01S 17/89* (2006.01)
- *G01S 7/48* (2006.01)
- *G05D 1/02* (2006.01)
- *E21B 3/00* (2006.01)
- *G06F 17/50* (2006.01)
- *G01S 7/486* (2006.01)

(52) U.S. Cl.
CPC ......... *G05D 1/0251* (2013.01); *G05D 1/0274* (2013.01); *G06F 17/50* (2013.01); *G05D 2201/021* (2013.01)

(56) References Cited

FOREIGN PATENT DOCUMENTS

| | | |
|---|---|---|
| CN | 102798412 A | 11/2012 |
| EP | 1176393 A2 | 1/2002 |
| EP | 1266124 B1 | 5/2006 |
| JP | 2008025163 A | 2/2008 |
| JP | 2010086031 A | 4/2010 |
| WO | 96/22547 A2 | 7/1996 |
| WO | 2007000488 A1 | 1/2007 |
| WO | 2008100201 A1 | 8/2008 |
| WO | 2010149856 A2 | 12/2010 |
| WO | 2011141629 A1 | 11/2011 |
| WO | 2012072870 A1 | 6/2012 |
| WO | 2013170348 A1 | 11/2013 |

\* cited by examiner

MINE CONTROL SYSTEM

RELATED APPLICATION DATA

This application is a § 371 National Stage Application of PCT International Application No. PCT/EP2015/050567 filed Jan. 14, 2015 claiming priority of PCT International Application No. PCT/EP2014/050598, filed Jan. 14, 2014.

BACKGROUND OF THE INVENTION

The invention relates to a mine control system for monitoring the excavation and other mine operations executed in a mine.

The field of the invention is defined more specifically in the independent claim.

Mine vehicles are used in mines, which may be underground or surface mines. The mine vehicle may be provided with one or more mine work devices for performing determined mine work tasks at the mine. The mine vehicle may be a rock drilling rig, transport vehicle or a loader, for example. Monitoring excavation and other mine work operations in large mines is complicated. At present, only scattering information about the mine and executed work in the mine is provided, whereby it is difficult to get an overall view of the mine.

BRIEF DESCRIPTION OF THE INVENTION

An object of the invention is to provide a novel and improved mine control system, mine control unit, and method of controlling mine vehicles.

The mine control system according to the invention is characterized by the features of independent apparatus claim.

The mine control unit according to the invention is characterized by the features of another independent apparatus claim.

The method according to the invention is characterized by the features of independent method claim.

An idea of the disclosed solution is that several mine vehicles operate in a mine and perform excavation or other mine operations. At least some of the mine vehicles operating in the monitored mine are provided with on-board monitoring means, whereby they may produce desired monitoring data when performing their work tasks or moving in the mine. The mine vehicles executing the monitoring may communicate with one or more mine control units external to the mine vehicles by means of data communication means. Thereby, the mine control unit receives the produced monitoring data from the mine vehicles. The mine control unit is also provided with one or more mines plans. Further, the mine control unit comprises suitable processing means and programs in order to compare the received monitoring data with the mine plan for determining the current state of the mine relative to the mine plan.

An advantage of the disclosed solution is that the mine control system is provided with needed monitoring data in order to produce an overall view of the mine and to monitor development of the mine. Comparison of the monitoring data to design data or stored data on previous situation provides valuable information on progress and readiness of tunnels and mine spaces, for example. The system also allows to ensure that excavation process of the mine is done in accordance with the designed mine plan and set requirements. Deviations may be notified at an early phase whereby corrective actions may be performed without delay. The system may also allow ensuring that the mine vehicles and other resources are utilized effectively. An additional advantage of the monitoring system is that the situation determination of the mine may be carried out without a need for extensive and specialized surveying and measuring infrastructure and equipment. A further advantage is that the procedure does not need skilled workers and can be easily automated. Furnishing the mine vehicles with monitoring means is easy and does not hamper the basic operation of the mine vehicle in any way.

According to an embodiment, the mine control unit of the mine control system may be configured to receive monitoring data from any kind of mine vehicles operating in the observed mine. The mine may comprise manually controlled mine vehicles and autonomously operable mine vehicles. The manually controlled mine vehicles may be remote controlled by operators, or alternatively the operators are on-board the mine vehicles. Thus, the disclosed solution is suitable to any mine vehicles despite of their control system and degree of automation. Furthermore, the mine vehicles may be different in structure as well as operationally. Thereby, the mine vehicle may be a rock drilling rig, bolting rig, transport vehicle, loading vehicle or measuring vehicle, for example. The mine vehicles of any kind may be provided with monitoring modules capable to monitor the operation of the mine vehicle and possibly also having means allowing surveying of surroundings of the mine vehicle when moving in the mine. Thus, the monitoring module may comprise one or more measuring means such as sensors, measuring devices and scanning devices. The monitoring module may also comprise one or more control units for controlling operation of devices and systems of the module and for processing produced and gathered measuring results. In addition to, the monitoring module may comprise one or more data communication units for producing data communication connection between the on-board module and the mine control unit of the mine control system. The data communication unit may also communicate with an on-board control unit of the mine vehicle and may transmit data to one or more external terminal devices or serves. The monitoring module may comprise fast coupling means so that the module is readily mountable to any mine vehicle.

According to an embodiment, the mine plan comprises a 3D model of the mine. The 3D model of the mine may comprise point cloud data in mine coordinate system. Further, one or more mine vehicles are provided with scanning devices for scanning surroundings of the mine vehicle in the mine for producing point cloud data. The one or more mine vehicles further comprise means for determining position of the mine vehicles in the mine coordinate system, whereby the produced point cloud data is connected to the detected data on position of the scanning in the mine coordinate system. The mine control unit is configured to receive the scanned data of the mine and to compare the produced point cloud data with the 3D model of the mine. The disclosed solution may implement a point cloud best fit method. The produced point cloud data of the scanning devices and the 3D model of the mine may be utilized in versatile manner, as will be disclosed below in this patent application. An advantage of the scanning technique is that it does not need any infrastructure to support the measurements. Further, the scanning provides statistical certainty since the outcome may be based on several measurements because of the fact that the measuring process is fast to execute.

According to an embodiment, the mine vehicles may be provided with position detection means and scanning means. The mine plan of the mine control unit comprises a 3D model of the mine. Thereby, the mine vehicle may produce point cloud data and may compare the scanned point cloud data to point cloud data of the mine plan. The mine control unit is provided with suitable programs, algorithms, processors and data processing means for detecting in the scanning data new or changed surrounding point cloud objects at the scanned position. Thereby, newly created or changed walls or other surfaces of the mine are detected and recorded. The mine control unit may incorporate the new point cloud data to the point cloud data of the realized 3D model of the mine. Thereby, the mine control unit may update the 3D model of the mine on the basis of the received scanning data. Thanks to this embodiment, changes in the mine are noted and may be taken into consideration. When the realized 3D model of the mine is up to date, reliable information about the mine may be used for several purposes, such as navigation, quality control, access control and collision prevention.

According to an embodiment, the mine control unit is provided with scanning data received from one or more mine vehicles. The mine control unit may process the received scanning data by extracting point cloud data of the surrounding surfaces and by removing point cloud data of all the other objects, such as people and other mine vehicles. Thus, a simplified point cloud data of the surrounding surfaces may be created. Thanks to the simplified point cloud data, storing and handling of the data is facilitated. Size of a data package of the simplified point cloud data may be smaller and the data does not include unnecessary information.

According to an embodiment, the mine control unit may produce a simplified point cloud data of the surrounding surfaces, as it is disclosed in the previous paragraph. Furthermore, the mine control unit may compare the new simplified point cloud data with the point cloud data of the 3D model of the mine. Based on the comparison of the point clouds, the mine control unit may update the 3D model of the mine by incorporating the simplified point cloud data to the realized 3D model of the mine. Thanks to the simplified point cloud data, no irrelevant data is incorporated to the 3D model of the mine. The updated 3D model may be used for any purpose.

According to an embodiment, the mine plan of the mine control unit defines development of rock cavities in several succeeding rounds, which are drilled and blasted. Thus, new rock cavity sections corresponding to the lengths of the rounds are formed in each round. A mine vehicle provided with the scanning device is configured to enter the new rock cavity section, determine position of the mine vehicle at the new section and then execute scanning of surfaces of the new rock cavity section for producing point cloud data on the developed surfaces. The mine control unit is configured to receive the scanned data of the developed new rock cavity sections. The mine control unit may incorporate the point cloud data to the 3D model of the mine in order to updating the realized 3D model of the mine. In this embodiment the mine vehicles entering the new rock cavity sections may serve as mobile surveying devices whereby no conventional manual surveying is needed. The use of the disclosed mobile surveying improves safety when compared to conventional manual surveying of the mine.

According to an embodiment, one or more of the mine vehicles operating in the mine are provided with scanning devices for producing point cloud data of the surroundings of the mine vehicles, when desired. The mine vehicle provided with the scanning means also comprises an on-board control unit provided with a 3D model of the mine. The onboard control device receives the scanned data from the scanning device and compares the produced point cloud data with the 3D model of the mine for detecting deviations between them. The on-board control device is provided with needed point cloud matching and processing means for executing the comparison. When the on-board control unit of the mine vehicle recognizes deviations in the comparison process, the on-board control unit may transmit only the detected deviating point cloud data to the mine control unit. The mine control unit may utilize the received data when determining the current state of the mine. In this embodiment the scanned point cloud data is pre-processed already in the mine vehicle and only the relevant data is communicated to the mine control unit. This way unnecessary loading of the data communication and processing means may be avoided. On the other hand, the scanning may be executed as often as needed, or even continuously, without the risk of overloading the system. In a detailed additional embodiment, the on-board control unit is provided with a realized 3D model of the mine and the on-board control unit is configured to compare the scanned point cloud data to the latest point cloud data of the realized 3D model of the mine in order to detect deviating portions between them. If the on-board control unit detects deviations between the point clouds, it may record the deviating data and may update the realized 3D model of the on-board control unit. The on-board control unit may also send the deviating data to the mine control unit, which may update the realized 3D model of the mine control unit. Further, in an alternative additional embodiment, the on-board control unit of the mine vehicle is provided with 3D model of the planned mine. The produced scanning data is compared to the designed mine model and when deviations between the realized mine and the designed mine model are detected, the deviations are communicated to the mine control unit. This way it is possible to inform the mine control unit about over and under excavation situations, as well as other quality problems in the excavation process. All in all, the embodiments disclosed in this paragraph help avoiding unnecessary transmission of data, and still, the produced data on the realized mine and quality of the excavation process is effectively provided for updating the current state of the mine.

According to an embodiment, one or more of the mine vehicles provided with the scanning device are configured to execute the scanning each time the mine vehicles are stopped. This way, scanning of the mine may be automated and scanning data may be produced repeatedly, whereby deviations may be noted without delays. In order to avoid heavy data transmission and processing it is possible pre-process the scanned data in one or more on-board control units and to transmit to the mine control unit only relevant information relating to detected changed or new point clouds.

According to an embodiment, the mine vehicle provided with the scanning device and/or other monitoring means is serving as a mobile surveying device. The mine vehicle may execute the surveying continuously when executing dedicated normal operations of the mine vehicle. If the mine vehicle is a rock drilling rig or a reinforcing rig, it may scan the surroundings when it stops at a work site for executing drilling or feeding reinforcing elements or material. It may also be defined that the scanning is executed at least once each time when the mine vehicle is not moving. Thanks to this procedure, the mine may be surveyed repeatedly and in parallel to the normal operational process without any need for extra resources. The 3D model of the mine may thus be accurate and updated.

According to an embodiment, the system comprises several rock drilling rigs each of them being provided with the scanning devices.

According to an embodiment, all the mine vehicles of the system are provided with the scanning devices.

According to an embodiment, position of the at least one mine vehicle in the mine coordinate system is determined by means of scanning the surrounding surfaces of the mine vehicle for producing point cloud data and executing a point cloud matching program for fitting the produced point cloud data to point cloud data of the 3D model of the mine. An advantage of this embodiment is that the mine vehicle and the mine need not to be provided with any other position measuring devices or infrastructure. However, in some cases the position detection based on scanning and point cloud matching procedure may also be used in combination with conventional measuring techniques.

According to an embodiment, position of the mine vehicle is determined by utilizing scanning and point cloud processing and matching techniques. In order to facilitate processing of point clouds, the mine control system utilizes only part of the point cloud data of the mine in the comparison process. Then, the mine control system may be configured to determine an area or section of the mine where the monitored mine vehicle is currently operating, and based on the position data, the system may compare the produced point cloud data to partial point cloud data of the mine. Thus, the comparison is not made to the whole 3D model of the mine plan, but instead the scanned point cloud data is compared only to a section of the mine where the mine vehicle is operating at the time of the monitoring. An advantage of this solution is that the amount of the data processed during the comparison is minor, whereby less calculation capacity is needed and processing time may be shorter.

According to an embodiment, the mine control system is provided with position data of one or more mine vehicles. The position of the mine vehicle in the mine coordinate system is determined by means of conventional position measuring devices or sensors on-board, or by utilizing detection of one or more position identifiers or markings arranged in the mine. Alternatively, positioning may be done by receiving radio signals and may then be based on RFID or WLAN positioning, for example. Further, the position of the mine vehicle may be determined by means of a laser measuring device or tachymeter. Thus, any suitable measuring system or device may be utilized for producing the needed data on position and direction of the mine vehicle. The position sensing and detection means may be arranged to a monitoring module or directly to the mine vehicle.

According to an embodiment, the mine control unit is configured to receive position data from the mine vehicles and is configured to visualize the positions of the mine vehicles on at least display device, thereby providing updated fleet management data. The positions of the operating mine vehicles in the mine is also valuable information about the current situation of the mine. Based on the position data, excavation and other mine work tasks may be controlled effectively.

According to an embodiment, the mine control unit is configured to indicate deviations between the mine plan and detected realized rock surfaces on the basis of the monitoring data. Based on the detected deviations, the mine control unit may produce data on quality of the excavation process in one or more sections of the mine. The deviating parts of the mine and other quality problems may be shown on a display device, for example. The system may be arranged to examine profile quality of the surfaces of the realized mine, success of blasts, as well as over and under excavated surfaces or mine sections.

According to an embodiment, the mine control system is configured to monitor quality of the excavation process and to detect changed and new portions of the mine. The mine control unit is configured to indicate the changed and deviating portions of the mine for an operator. The mine control system may comprise a control room provided with one or more display devices. The updated data may be displayed on the display device with special markings or colors. Thus, supervision is facilitated. The system also facilitates producing different quality reports and other documentation. Further, the system allows storing data on the excavation process and reinforcing procedures of the excavated rock caverns.

According to an embodiment, the mine control system is provided with a mine plan comprising a designed tunnel line and profile of a tunnel or rock cavity to be excavated. The tunnel profile determines inner surfaces of the tunnel along the tunnel line. The tunnel, as well as other rock cavities and spaces, may have the predesigned tunnel line defining the direction of the space to be excavated. The tunnel line may be a central line of the tunnel or rock cavity. Further, the tunnel and other rock spaces may have predesigned profile defining contour of the space to be excavated. In addition to theoretical excavation profile the mine plan may determine allowed tolerances for the theoretical excavation profile. Thereby, the mine plan may also comprise minimum and maximum profiles. The mine control system may compare the realized tunnels to the designed tunnel data and may then determine the current state of the tunnels and the mine. The system may also detect deviations in the excavated spaces and may create quality data on the excavation process.

According to an embodiment, the mine control system is provided with a mine plan comprising a plurality of drilling patterns defining positions and directions of drill holes for rounds to be drilled at predetermined locations in the mine. In order to determine the state of the mine the mine control unit retrieves or receives data on the realized rounds being excavated and compares the real data to the design data for detecting deviations and producing quality data on the excavation process of the rounds.

According to an embodiment, the mine control system is provided with a mine plan determining excavation of at least one rock cavity in several successive rounds which are located at a distance from each other along a planned central line of the rock cavity and wherein each round is provided with several drill holes to be drilled on a drilling surface of the round. Further, at least one mine vehicle provided with on-board monitoring means is configured to determine realized positions of the rounds and is configured to transmit the determined position data to the mine control unit. The mine control unit is configured to determine realized advance of the excavation of the rock cavity by detecting the position of the recent round. The determined realized advance may provide information about success of the excavation process. The data may be taken into consideration by modifying drilling patterns and charging plans, for example.

According to an embodiment, a tunnel or rock cavity of the monitored mine is excavated by utilizing face drilling, wherein start points of the drill holes to be drilled are on a bottom face of a tunnel or other rock cavity. The mine control unit may determine realized advance of the excavation of the rock cavity by detecting the position of the face of the recent round. The determined realized advance may provide information about success of the excavation process, and may be taken into consideration when drilling and charging the following rounds. The advance of the excavation work in tunneling and drifting may also be called pull per round or yield per round.

According to an embodiment, one or more tunnels or rock cavities of the monitored mine are excavated by utilizing fan drilling, wherein start points of the drill holes to be drilled are on an inner surface of preformed pilot tunnels or cavities. In other words, the drill holes are drilled on contour surfaces of the cavities and the cavities are enlarged by blasting the drill holes after being charged. The mine control unit may determine realized advance of the excavation of the one or more rock cavities by detecting positions of the drilled and blasted fans, or alternatively by detecting realized face surfaces of the rounds in the direction of the tunnel lines.

According to an embodiment, one or more mine vehicles of the system are provided with on-board monitoring means for determining realized positions of two consecutive rounds. The detected position data may be transmitted to the mine control unit, which may determine realized advance of the round by detecting distances between the two rounds. Further, the mine control unit may compare the determined length of the round to the planned length of the round and may indicate detected deviations. This way it is possible to monitor success of the excavation process and to make needed amendments to parameters of the process.

According to an embodiment, one or more mine vehicles of the system are configured to determine realized profile of the round by means of monitoring means and may transmit the determined profile to the mine control unit. The detected profile of the round defines the realized surfaces limiting the created space. In other words, profile along advance of the round is determined. The surface profiles of the round may be determined by scanning means, for example. The scanned profile may comprise point cloud data and position data of the points in a mine coordinate system.

According to an embodiment, the mine control unit is configured to determine volume of the blasted rock material in one round, or alternatively, in two or more successive rounds. The detected volume data may be utilized in determining the state of the mine. The mine control unit determines volume of the at least one excavated round by means of the detected advance of the round and the detected profile of the round. In other words, the mine control unit may calculate the excavated volume based on information about advance and one or more profiles along the new advance. The defined volume may comprise combined volumes of several consecutive rounds, in case advance of each round is not measured individually. Thus, the measurements may be performed at desired intervals, whereby the combined advance is determined after excavation of two or more consecutive rounds.

According to an embodiment, the mine control unit is provided with sensed data on realized profile of one or more rounds. The mine plan comprises data on planned profiles for the rounds. Then, the mine control unit may compare the realized profile of the round to the planned profile determined in the mine plan and may indicate detected deviations between the profiles. Thereby, the system may determine the state of at least one section of the mine on the basis of the disclosed profile comparison.

According to an embodiment, the mine control unit is provided with a mine plan comprising planned shapes for bottoms of the rounds to be excavated. The shapes of the bottoms are affected by drilling patterns and charging patterns or plans designed for the rounds to be drilled and blasted. The mine control unit is configured to compare the detected realized face profiles to the designed shapes of the bottoms of the rounds in order to examining success of blasts of the rounds. The disclosed solution may be utilized to detect deviating face profiles and reasons for causing the deviations. The executed drilling pattern and positions of start and end points of the drill holes of the drilling pattern may be compared to the scanned or otherwise detected realized surface shape of the bottom of the round after being blasted. The results of the comparison may be utilized for analyzing reasons for the detected deviation. Thus, it may be possible to notify if the deviations are caused by defective drilling or drilling pattern, or by the excavated rock conditions, for example.

According to an embodiment, drill hole data and calculated profile and/or shape based on the drill hole data is compared to sensed data of realized surfaces and shapes of the excavated round. Thus, the mine control unit may be configured to receive drill hole data of the drilled holes of the round from at least one rock drilling rig. The rock drilling rig may measure the drill hole data during drilling and may send the data to the mine control unit, or may alternatively pre-process the data in an on-board control unit. The drill hole data may comprise start points and ends points of the drilled holes, as well as directional angles and lengths of the realized holes. Based on the recorded data, the control unit may determine calculated profile data of the round. Tunnel profile of the round may be calculated by means of positions of end points of an outermost drill hole row of the round, for example. Then, the calculated tunnel profile may be compared to the realized profile data in the control unit, whereby deviations between the realized tunnel data and the data based on drilling data may be detected. The realized tunnel data may be determined by means of the scanning means, for example. In addition to the tunnel profile, or alternatively, volume and 3D-shape of the round may be calculated on the basis of the realized drill hole data and may be compared to the scanned data of the realized surfaces of the excavated round. The results of the comparison may be utilized for analyzing reasons for the detected deviation. Thus, it may be possible to notify if the deviations are caused by defective drilling or drilling pattern, or by rock conditions or geological issues of the excavated rock, for example.

According to an embodiment, the mine control unit is provided with a mine plan comprising theoretical profiles for the rock cavities to be excavated. The mine control unit is further provided with monitoring data relating to the shapes of the developed rock cavities. The mine control unit compares the determined realized profiles of the surfaces of the excavated rock cavities to the theoretical profiles of the mine plan and indicates possible over excavations or under excavations relative to the input theoretical profiles. Thus, the mine control system may produce data on quality of the excavation. The current state of the mine may comprise information about the mentioned over and under excavations, for example.

According to an embodiment, the mine control unit is provided with monitoring data on one or more realized rounds. The mine control unit may be provided position and profile of the round. Thus, the position of the face of the round and the profile of the round may be determined by means of a rock drilling rig provided with the monitoring means. The measuring data may be transmitted to the mine control unit. The rock drilling rig may be provided with one or more scanning devices for measuring the round. Alternatively, conventional measuring sensors or devices may be used. A boom of the rock drilling rig may be instrumented and may be used for executing the needed face position and round profile measurements. This embodiment allows the face at the bottom of a tunnel or corresponding rock space to be determined and the profile of the round to be determined. The determined data may be taken into consideration when determining quality of the excavation process and when updating the state of the mine.

According to an embodiment, the rock drilling rig is provided with at least one scanning device for scanning the surroundings. Then, the position of the rock drilling rig in the mine is determined by scanning the surroundings for producing point cloud data and by executing point cloud matching with the point cloud data of the 3D mine model a mine coordinate system. In this embodiment the mine control system is provided with a mine plan comprising 3D model of the mine and the position of the rock drilling rig in the mine coordinate system is determined in at least one control unit. The point cloud matching process may be executed in a control unit of a scanning module, in a control unit of a rock drilling or in a mine control unit. The control units may be provided with processors for executing the needed programs. Since the position of the rock drilling rig is determined in the mine coordinate system the position is also known in the mine plan, as well as position of the round and position of the face of the round.

According to an embodiment, the rock drilling rig is provided with a scanning device configured to detect distance between the carrier and the face of a bottom of a round. Thus, the realized position of the face relative to the carrier may be determined quickly and when needed.

According to an embodiment, the rock drilling rig is provided with the scanning device allowing scanning in a tunnel line direction towards the face at the bottom of the tunnel or corresponding rock cavity. The scanning produces point cloud data provided with coordinates in the mine coordinate system. At least one control unit is configured execute point cloud processing program or algorithm for detecting the greatest depth in the tunnel line towards the face at the bottom of the tunnel or rock cavity. Then the realized position of the face may be determined in the mine coordinate system.

According to an embodiment, scanning and point cloud processing techniques and the produced point cloud data disclosed in the previous embodiments may also be utilized to produce the surface profile of the face at the bottom end of the tunnel or rock cavity. Thereby, the realized surface profile of the previously blasted round and the created rock surface may be determined. This data may be used to determine quality of the drilling and charging, for example. The data may also be utilized to adjust drilling patterns and charging plans. The surface profile of the face may also be called topography of the face.

According to an embodiment, the mine control system is arranged to receive monitoring data from one or more rock drilling rigs comprising one or more booms. The boom may comprise a feed beam at the distal end portion of the boom. The boom is instrumented and the relative location between the carrier and the face is determined by arranging the feed beam or a mining work device in contact with the face and determining the location by means of the instrumented boom. The boom may comprise one or more sensors or measuring devices, for determining position and direction of the boom relative to a carrier of the mine vehicle. The boom may comprise two or more boom parts and joints between the boom parts. The joints may be provided with angle measuring devices, for example. Furthermore, between the boom and carrier, and between the boom and the feed beam may also be suitable sensors.

According to an embodiment, the mine control system is arranged to receive monitoring data from one or more rock drilling rigs comprising one or more booms provided with feed beams and mine work devices supported to the feed beams. Position and direction of the feed beam or the mining work device arranged in connection with the feed beam is determined by utilizing scanning technique. Then, the surroundings of the rock drilling rig is scanned and a monitored object, such as the feed or the mine work device, is inside a reach area of a scanning device arranged on the mine vehicle. At least one control unit is provided with reference data, such as point cloud data of the monitored object. The control unit may be in connection with the scanning device. A point cloud processing program is executed in the control unit and the monitored object is searched from the point cloud data of the surroundings. The points of the point cloud comprise coordinate data whereby the control unit may determine position and direction of the monitored object. Thus, in this embodiment position of the monitored object, such as the feed beam or the mine work device, is searched from the scanned point cloud data by means of a point cloud matching program and the reference point cloud data of the monitored object. After match is found between the points of the produced point cloud and the reference point cloud, coordinates of the matching points may be determined. Thereafter the position and direction of the monitored object may be determined. The boom may be without any sensors or measuring devices, when the disclosed positioning determination is used, or alternatively, the boom may be instrumented and may comprise conventional sensors, whereby both scanning means and sensors may be used. When the scanning technique is used together with the conventional joint measurement techniques, some of the joint sensor may be removed. To sum up, the disclosed solution may allow removal of all sensors in the boom of the rock drilling rig and may still give accurate position and angle information for drilled holes or installed rock reinforcing bolts. The disclosed system may also avoid a need for any compensation model needed for deflection of the boom.

According to an embodiment, the mine control system is part of a control room product configured to visualize the at least one monitored feature on at least one display device. The system may provide visualization of the entire mine in a control room. With the real scanned model of the mine, the fleet management system may show the mine as it is and also including the locations of the mine vehicles in the realized model.

According to an embodiment, the mine control system comprises at least one server allowing monitoring data to be distributed to one or more terminal device via a data connection.

According to an embodiment, the mine control system is part of a control room product comprising a fleet managing feature monitoring the positions of all or selected mine vehicles. The system may also monitor current positions of selected or all mine vehicles operating in a selected observation area of the mine. Further, the system may monitor drilling and bolting rigs and may determine and record position and directions of drill holes currently influenced by the mine work devices of the monitored rigs.

According to an embodiment, the mine control system is part of a control room product comprising a fleet managing feature monitoring the operating status of all or selected mine vehicles. The system may also monitor current status of the mine vehicles operating in a selected observation area. Further, the system may monitor estimated remaining duration of the current work task of the mine vehicle or the mine work device.

According to an embodiment, the mine control system is part of a control room product comprising a fleet managing feature monitoring the operating condition and maintenance need for all or selected mine vehicles.

According to an embodiment, the mine control system is part of a control room product comprising a fleet managing feature monitoring a general status of one or more mine vehicles and one or more mine work devices.

According to an embodiment, the mine control system is configured to visualize the at least one monitored feature on at least one display device.

According to an embodiment the mine control system comprises at least one server allowing monitoring data to be distributed to one or more terminal device via a data connection.

According to an embodiment, the mine vehicle comprises at least one data communication device allowing data communication between a control unit on-board and a mine control system. The data communication may be based on any wireless data transfer technique. The mine may be provided with a wireless network utilizing radio wave signals. The data transmission may be based on a wireless local area network (WLAN), for example.

According to an embodiment, the mine control system may comprise one or more computers or control units external to the mine and mine vehicle. Alternatively, the mine control system may comprise one or more servers allowing access to electrical terminal devices for retrieving the data transmitted from the control unit where the monitoring data in analyzed. The mine control unit may also be considered to mean other data communication and distribution means allowing access to the processed data.

According to an embodiment, the mine vehicle is provided with a monitoring module comprising a frame, one or more monitoring means and one or more data transmission devices or units. The monitoring module may communicate with the mine control unit by means of the data transmission device. The monitoring means may comprise a scanning device and/or one or more other measuring and sensing devices. The monitoring module may also comprise one or more control units provided with processors and needed computer programs and algorithms for processing the produced monitoring data. The monitoring module may be designed so that it is mountable to any mine vehicle.

According to an embodiment, the scanning device is a laser scanner.

According to an embodiment, the scanning device comprises at least one camera. The scanning device may be based on stereo vision system comprising at least two cameras. Alternatively, the scanning may be based on a technology known as a depth from focus-system, wherein one camera is used and the method basically works by taking a focus stack of an object, and then analyzing the luminance of each pixel in relation to its neighbors. The control unit may be provided with image processing system for processing data received from the one or more cameras.

According to an embodiment, the scanning device comprises in addition to the scanning unit at least one camera for recording color information of the scanned obstacles. The recorded color information may be connected to the scanned point cloud data. This way additional information may be gathered.

According to an embodiment, the 3D scanning data is obtained by round trip time of flight of a laser that is swept across measured surface or object. This type of remote sensing technique is also known as LiDAR (Light Detection And Ranging).

According to an embodiment, the 3D scanning data is obtained by round trip time of flight of single (modulated) light source and the return times of reflections from different parts of the measured surface or object. This type of remote sensing technique is also known as ToF (Time of Flight). In this embodiment ToF-cameras may be used.

According to an embodiment, the 3D scanning data is obtained by geometry of a known pattern of light projected to the measured surface or object shown in one or more camera images. This type of 3D scanning is also known as a structured light 3D scanning technique.

According to an embodiment, the 3D scanning data is obtained by analysis of multiple pictures taken of same target from different points of view. In this embodiment a stereo camera system may be exploited. The control unit may be provided with an image processing system for processing image data received from the two or more cameras.

According to an embodiment, the fastening unit of the scanning device comprises fast coupling means whereby the scanning device is readily mountable and dismountable to the mine vehicle. The fast coupling means may comprise at least one magnetic coupling element.

According to an embodiment, the mine is an underground mine. The underground mine comprises an underground rock space, such as a tunnel, cavern or a storage hall.

According to an embodiment, the mine is a surface mine comprising obstacles on the surface. The surface mine may be an opencast mine.

According to an embodiment, a mine control unit for controlling several mine vehicles comprises connection means for being in operational communication with the several mine vehicles, receiving means for receiving monitoring data from the several mine vehicles and processing means for processing data, and the mine control unit is provided with a mine plan, the mine control unit is configured to receive monitoring data from the several mine vehicles, and the mine control unit is configured to compare the received monitoring data with the mine plan for determining the current state of the mine relative to the mine plan.

The disclosed mine vehicle may be utilized when implementing the disclosed mine control system and mapping method. The detailed embodiments, which are disclosed in connections to the mine control system and the mine vehicles, also relate to the method, and vice versa.

The above-disclosed embodiments can be combined to form suitable solutions provided with necessary features disclosed.

BRIEF DESCRIPTION OF THE FIGURES

Some embodiments are described in more detail in the accompanying drawings, in which.

For the sake of clarity, the figures show some embodiments of the disclosed solution in a simplified manner. In the figures, like reference numerals identify like elements.

DETAILED DESCRIPTION OF SOME EMBODIMENTS

Figures 1, 2:
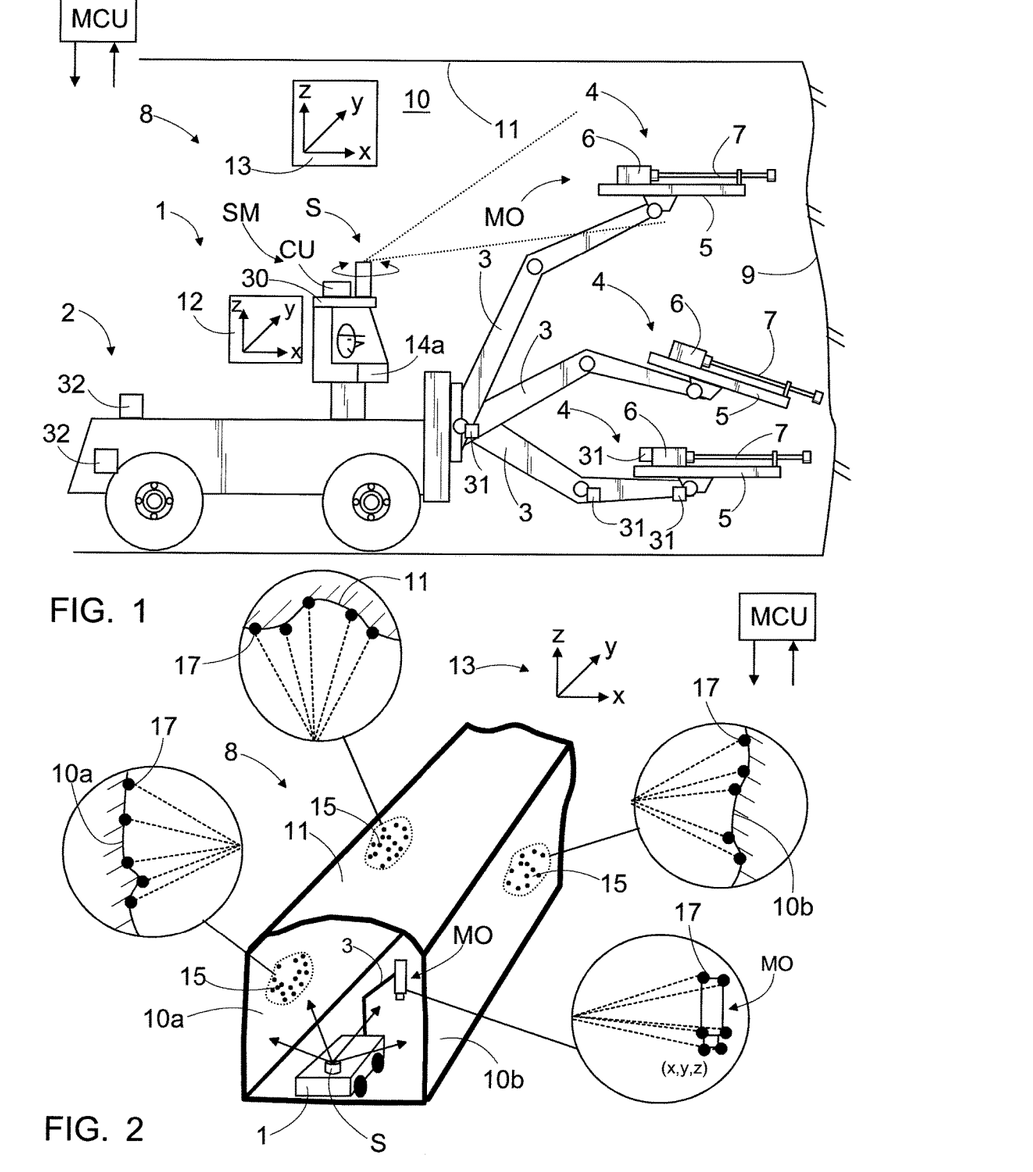
FIG. 1 is a side view of a rock drilling rig provided with scanning and monitoring means.
FIG. 2 shows schematically a principle of scanning surfaces and physical obstacles surrounding a mine vehicle.
Figure 12:
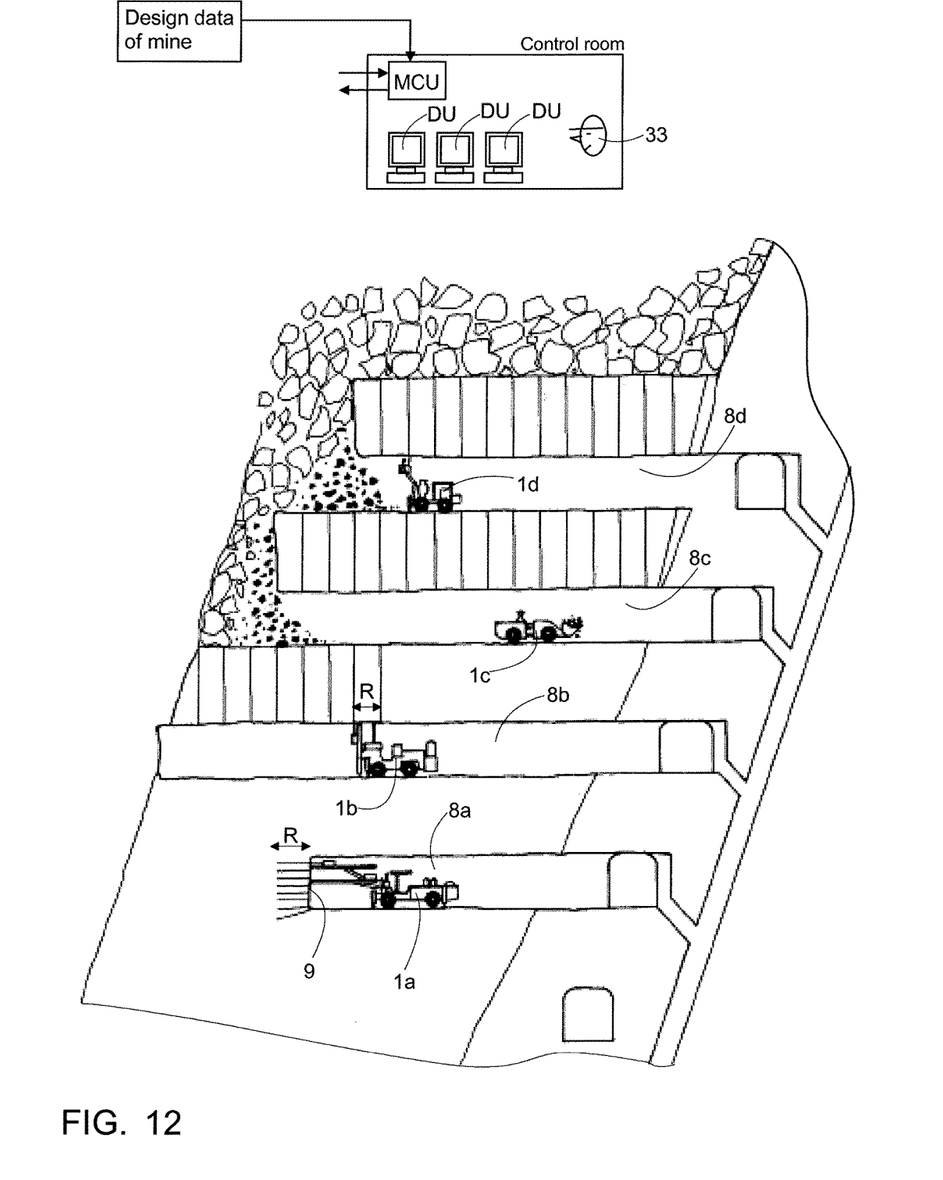
FIG. 12 is a schematic and strongly simplified view of a mine comprising several tunnels and different mine vehicles operating in tunnels.

FIG. 1 shows a rock drilling rig 1 as an example of a mine vehicle. Also rock bolting rigs, charging rigs, measuring vehicles, transport vehicles and loading vehicles are mine vehicles. Thus, the mine vehicles may be provided with mine work devices such as rock drilling units, bolting units, charging units, loading units and load carrying units, as it is shown in FIG. 12. The disclosed solution may be applied for all type mine vehicles.

The rock drilling rig 1 may comprise a movable carrier 2 and one or more booms 3 connected to the carrier 2. At a distal end portion of the boom 3 may be a drilling unit 4. The drilling unit 4 may comprise a feed beam 5 and a rock drilling machine 6 supported on it. The rock drilling machine 6 may comprise a shank at a front end of the rock drilling machine 6 for connecting a tool 7. At least one boom 3 may comprise a mine work device other than the drilling unit. Thus, the mine work device may be a rock bolting unit or a charging unit, for example.

In FIG. 1 the rock drilling rig 1 is operating in an underground mine space 8, which may be a tunnel, storage hall or corridor, for example. The mine space 8 may comprise an end face surface 9, wall surfaces 10 and a roof surface 11. The rock drilling rig 1 is provided with one or more scanning devices S for measuring surroundings of the rock drilling rig 1. The scanning device S may scan 360° and may thus measure the surrounding surfaces and other obstacles around the rock drilling rig 1 and produce scanning data for the system. The scanning device S may comprise a laser scanner, a camera or any other device capable of producing point cloud data. The scanning device S may be placed on the carrier 2.

The scanning device S may be placed in a known position on the mine vehicle. Then coordinates of the scanning device are known in machine coordinates system 12 of the mine vehicle. The scanning device sees around and may then detect also one or more objects, parts or components of the mine vehicle as well.

Alternatively, the position of the scanning device S need not be accurately predetermined and calibrated when the disclosed system utilizes point cloud matching techniques. Then, at least one reference component or object of the rock drilling rig is detected in the scanning data and produced point cloud data of the detected object is utilized in determination of relative position of the scanning device S on the carrier 2.

The rock drilling rig 1 has a machine coordinate system 12 and the mine has a mine coordinate system 13. On-board the rock drilling rig 1 may be one or more control units 14a for receiving scanning data, performing point cloud matching and searching measures, producing position data and executing needed coordinate transformations according to principles disclosed in this patent application.

The scanning device S may be part of a scanning module SM comprising a frame 30 provided with mounting means, and a control unit CU provided with a processor and needed programs for executing the above discussed search and position determination procedures.

The boom 3 may be without any sensors since the needed position and direction data may be produced by the scanning. However, the boom 3 and the mine work device may also comprise conventional sensors or measuring means 31 for position and direction determination in addition to the scanning means. The scanning and measuring means may be used together for example in situations when the scanning range does not cover all possible boom positions.

The mine vehicle 1 may also be provided with one or more position sensing or measuring devices 32 for determining position of the mine vehicle 1 in the mine. Thus the position and direction of the mine vehicle 1 in the mine coordinate system may be determined by means of the conventional measuring means of alternatively by utilizing scanning and point cloud matching techniques.

FIG. 1 further discloses that the mine vehicle 1 may communicate with one or more external mine control units MCU, which may be part of a mine control system. Position of the mine vehicle 1, position of the end face 9, profile of the mine space 8, and also topography of the face and the inner surfaces of the space 8 may be determined and transmitted to the mine control unit MCU.

FIG. 2 shows scanning of surfaces of a mine space 8 surrounding a mining vehicle 1. Thus, point cloud data 15 may be produced of wall surfaces 10a, 10b and a roof surface 11. Also, greatest depth of the space 8 i.e. the bottom face may be scanned. As it is disclosed in the simplified FIG. 2 with enlargements, the surfaces of the wall surfaces 10a, 10b and the roof surface 11 have individual shapes since the rock material is detached by blasting. Topography of the surfaces may be considered to be a kind of finger print of the mine. 3D scanning data of the realized surfaces of the mine space 8 may be produced. Thus, a 3D model of the mine may be updated on the basis of the scanned point cloud data.

FIG. 2 also discloses that by means of the scanning, a monitored object MO may also be detected and a point cloud of it may be produced. The point cloud data of the monitored object MO comprises points, which are characteristic for the monitored object. Based on the shape the points create, the monitored object MO may be recognized in a searching step of the scanning procedure. The control unit 14a may then determine coordinates for the recognized points defining the monitored object in the point cloud and may determine position and direction of the monitored object in the machine coordinate system 12. The control unit 14a may transform the position and direction data of the monitored object MO into coordinates of the mine coordinate system 13 when the location of the mine vehicle 1 is known. The position of the mine vehicle 1 in the mine may be determined by means of the scanning techniques or by means of conventional measuring means. The position of the mine vehicle 1 and the monitored object MO, as well as information about the realized surface topography of the scanned mine space 8 may be transmitted to the mine control unit MCU.

Figure 4:
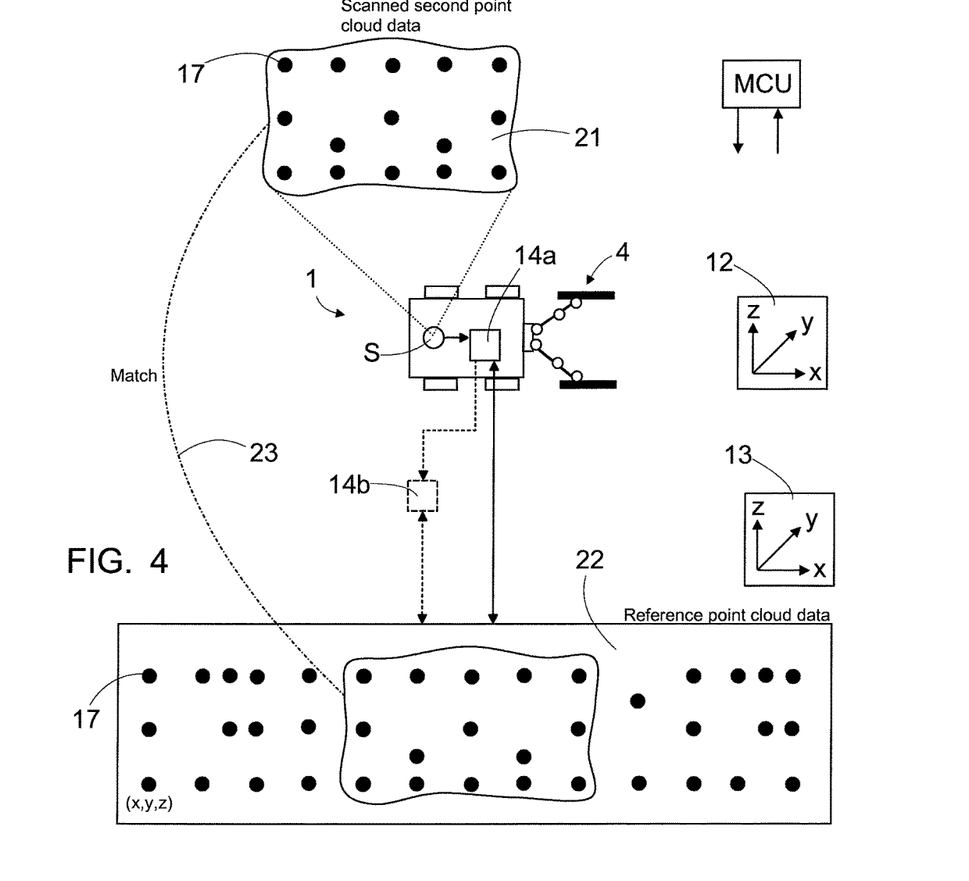
FIG. 4 is a schematic view of a basic principle of point cloud matching utilized when processing scanning results.

In FIG. 2, as well as in FIG. 4, it is illustrated by black dots 17 points where a ray of a scanning device S meets a physical target and causes detection. The point cloud data 15 comprises several points 17 created by the scanning. The points 17 are shown as black dots. It can be considered that the point cloud data represents information of what the scanning sees. Every point 17 has coordinates x, y and z in machine or scanner coordinate system 12, whereby position and direction of the monitored object MO may be determined relative to the scanning device S in the machine coordinate system 12. The monitored object MO may be found from the point cloud data on the basis of reference data input to the control unit 14a or CU.

Also, position, direction and topography of a face surface at a bottom of the mine space 8 and other surfaces may be determined in the mine coordinates system 13 when the position of the mine vehicle is known and coordinate transformations are utilized.

Figure 3:
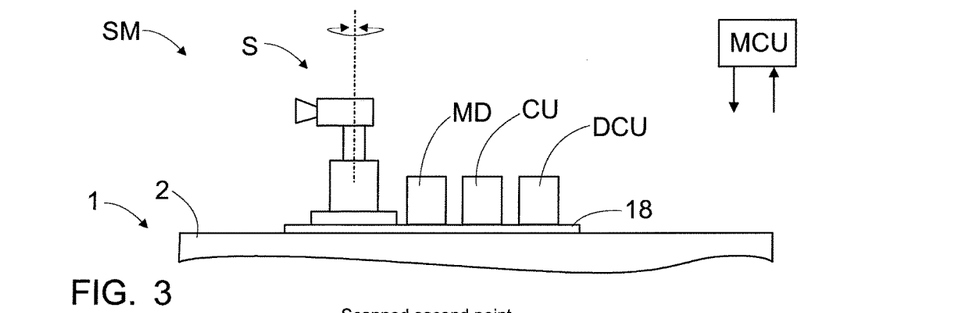
FIG. 3 is a schematic side view of a scanning module arranged on a carrier of a mine vehicle.

In FIG. 3 a monitoring module, in this case a scanning module SM, is arranged on a carrier 2 of a mining vehicle 1. The scanning module SM comprises a scanning device S, a frame 18 and a control unit CU. The module may also comprise one or more measuring or sensing devices MD in addition to the scanning device S. The measuring device MD may be a position sensing device, for example. The control unit CU may be arranged to process the measuring data received from the scanning device S and the measuring device and may send by means of a data communication unit DCU only the processed data and data elements to a mine control unit MCU. Further, the scanning device S or scanning module may comprise fast coupling means whereby it can be easily mounted to the mine vehicle 1.

FIG. 4 discloses a basic principle of determining position and orientation of a mine vehicle 1 by means of scanning and point cloud matching. A surrounding of the mine vehicle 1 is scanned and a second point cloud data 21 is produced. An initial first point cloud data 22 may be created beforehand and it may be stored to a control unit 14a on-board the mine vehicle 1 or to an external control unit 14c. The control unit 14a, 14c may be provided with a processor and a point cloud matching program or algorithm for matching the second point cloud data 21 to the first point cloud data 22. Thus, the first point cloud data 22 serves as a reference point cloud data and the second point cloud data 21 serves as an operational point cloud data. In FIG. 4 the match 23 is shown in a strongly simplified manner. On the basis of the match 23, the control unit 14a or 14b may determine position and orientation of the mine vehicle 1 in a mine coordinate system 13. Every point 17 of the point cloud data has x-, y-, and z-coordinates. In the simplified example of FIG. 4, the second point cloud data 21 fits completely to the reference point cloud data 22.

The above mentioned principles of point cloud matching analysis and best fit procedures of point clouds may be utilized also for searching and detecting position and direction of a monitored object, such as a boom or mine work device of a mine vehicle During pattern matching the system searches the monitored object and calculates position and direction data for it.

Figure 5:
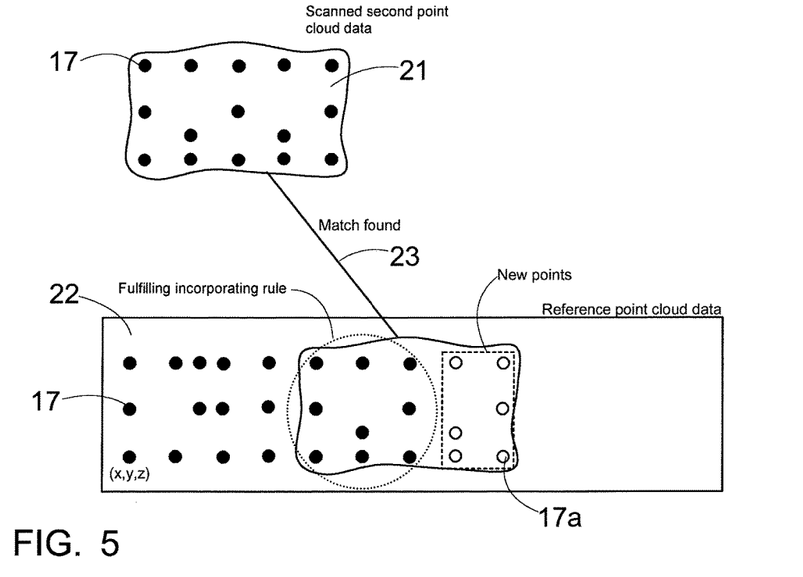
FIG. 5 is a schematic and strongly simplified view of a process detecting new or changed surfaces of a mine, and incorporating the detected deviating point cloud data after matching scanned data with a reference data.
Figure 6:
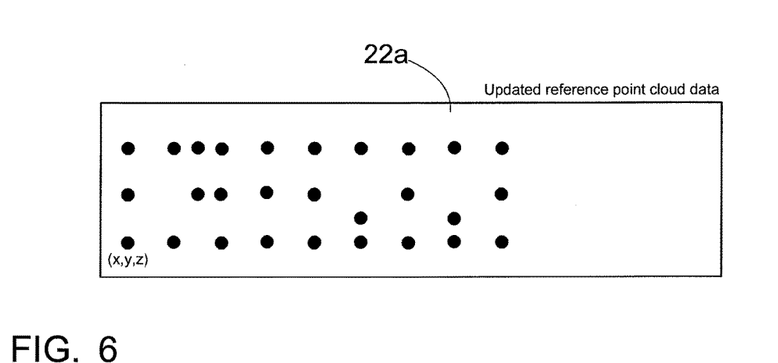
FIG. 6 is a schematic and strongly simplified view of an updated reference point cloud data, which incorporates detected new scanned points.

FIG. 5 discloses detecting new or changed surfaces of a mine. A mine vehicle provided with a scanning device may serve as a mobile surveying device. Thus, the mine vehicle may scan the surroundings when it stops at a work site for executing drilling or any other normal mine operation. A control unit is configured to execute point cloud matching analysis and to compare an operational second scanning data 21 to a reference scanning data 22 stored in the control unit or retrieved therein. During pattern matching the system detects if the operational second scanning data 21 comprises one or more new surrounding points 17a, which do not exist in the reference point cloud data 22. These new points 17a are shown in FIG. 5 as dots with white filling. The control unit may be provided with one or more incorporating rules defining required matching ratio between the second scanning 21 and the reference point cloud data 22. The incorporating rule may define a need for 50% matching, for example. If the set incorporating rule is fulfilled, the new points 17a are incorporated to the reference point cloud data 22. Thus, the mine vehicle allows newly created walls or changed surfaces to be detected and recorded. FIG. 6 discloses the updated new reference point cloud data 22a, which incorporates detected new scanned points.

Figure 7:
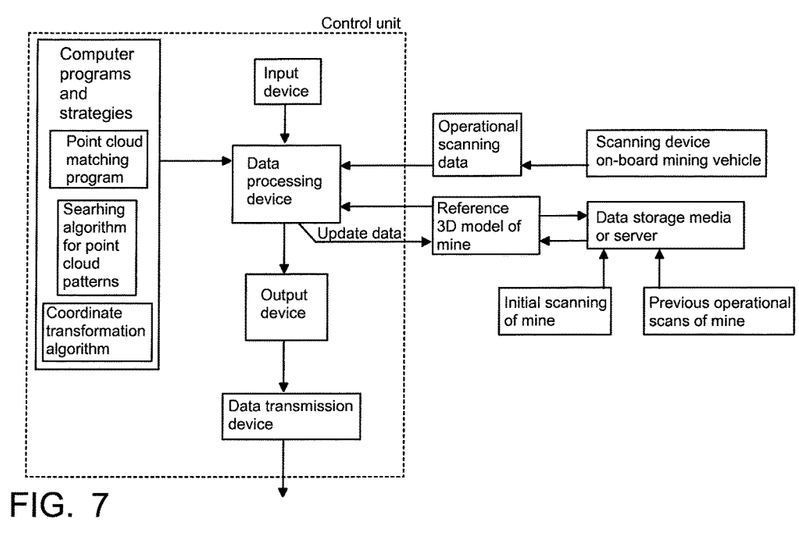
FIG. 7 is a schematic diagram showing related elements, processing means and features of a control unit being able to process point cloud data.

FIG. 7 shows a control unit and needed programs executable in a processor of the control unit for processing the produced point cloud data. The disclosed control unit may be on-board the mine vehicle, whereby it may pre-process the monitoring data and may transmit only the outcome to the mine control unit by means of a data transmission device.

Figure 8:
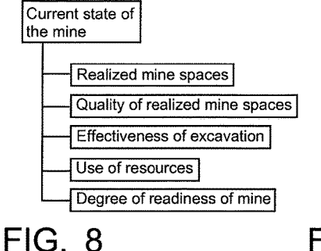
FIG. 8 is a diagram showing some features relating to the current state of the mine.

FIG. 8 shows in a simple diagram some features that are determined by means of the disclosed monitoring system. One or more of the features shown in FIG. 8 may be considered to represent the current state of the mine.

Figure 9:
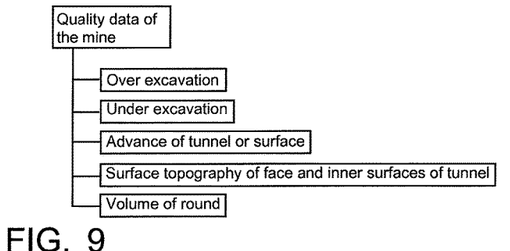
FIG. 9 is a diagram showing feasible quality data of the mine determined by the mine control system.
Figure 10:
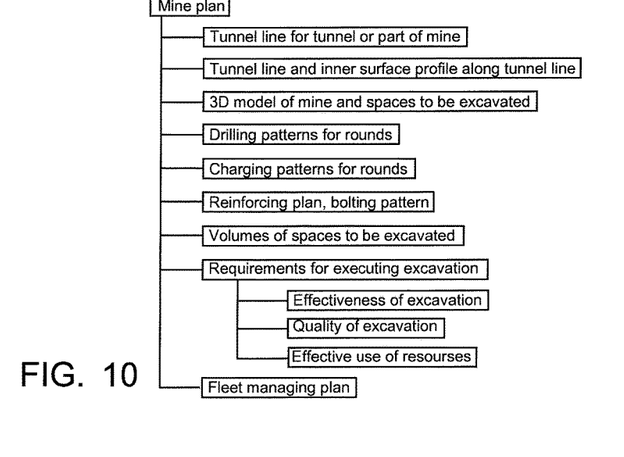
FIG. 10 is a diagram showing feasible data included in the mine plan and being input to the mine control unit.

FIG. 9 shows in a simple diagram some features representing quality data of the monitored mine and being determined by the mine control system. FIG. 10 demonstrates in a simple diagram what the mine plan may comprise. It should be noted that in FIGS. 8, 9 and 10 no exhaustive listings of the related features are disclosed.

Figure 11:
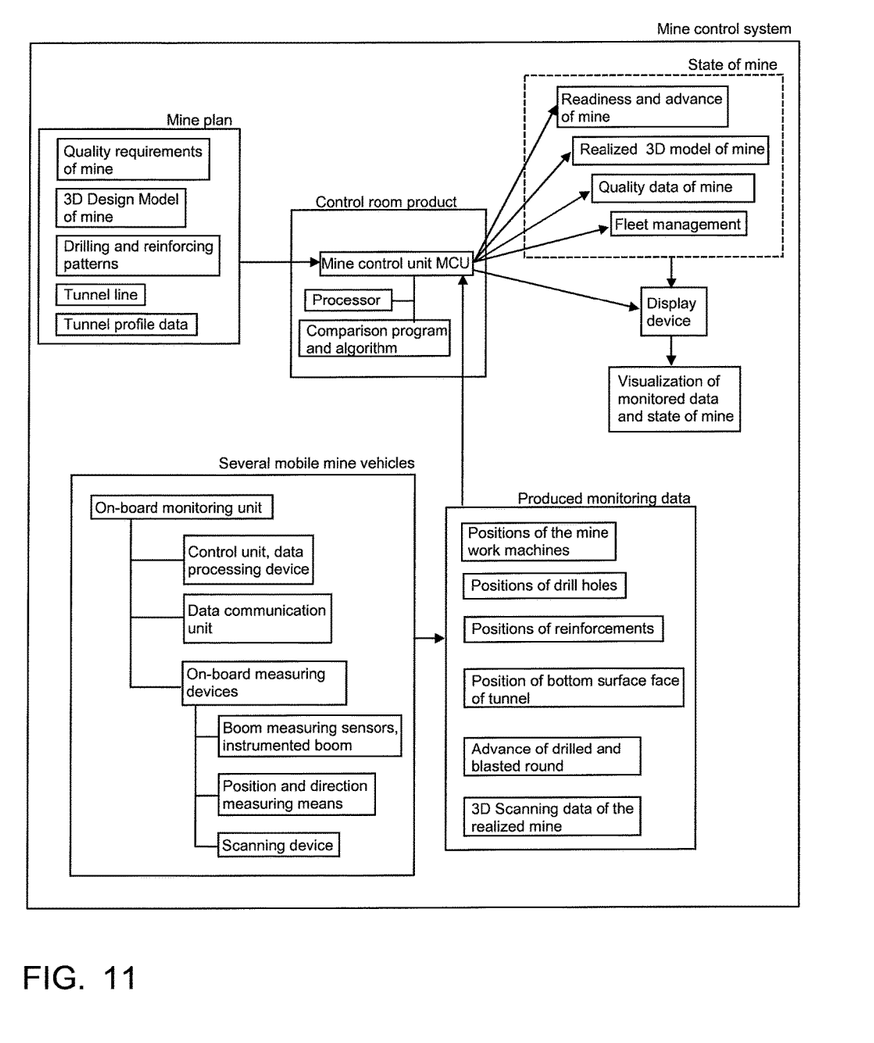
FIG. 11 is a diagram showing a feasible embodiment of a mine control system and related means and elements.

FIG. 11 shows a simple diagram of a feasible embodiment of a mine control system and related means and elements. The disclosed issues and features are discussed above in this patent application in more detailed.

FIG. 12 shows a mine comprising several tunnels 8a-8d and different mine vehicles 1a-1d operating in the tunnels. At the lowermost tunnel 8a there is face drilling rig 1a drilling blast holes to an end face of the tunnel. A fan drilling rig 1b is drilling a fan-like drilling pattern in a second tunnel 8b. In a third tunnel 8c a loading vehicle 1c is carrying detached rock material, and further, a charging vehicle 1d is operating in a fourth tunnel 8d. All these mine vehicles operating in the mine may be provided with monitoring or scanning modules and/or other monitoring means whereby they may produce monitoring data and send it to the mine control unit MCU. The mine control unit MCU may be located in a control room and may be connected to one or more terminal devices or display units DU for providing the operator 33 information about the current status and for displaying situation reports.

When the fan drilling rig 1b is utilized in tunneling, it may operate in a pilot tunnel and may drill blast holes to walls and ceiling of the pilot tunnel. After blasting the drill holes the pilot tunnel is enlarged. Two successive drill hole fans define length of a round R. In the face drilling, the face drilling rig 1a drills drill holes to an end surface i.e face of the tunnel 8a. After development excavation, the formed mine spaces may be surveyed by means of the monitoring modules of the mine vehicles. The monitoring module may comprise scanning device for scanning the surfaces of the tunnels 8a-8d.

Figure 13:
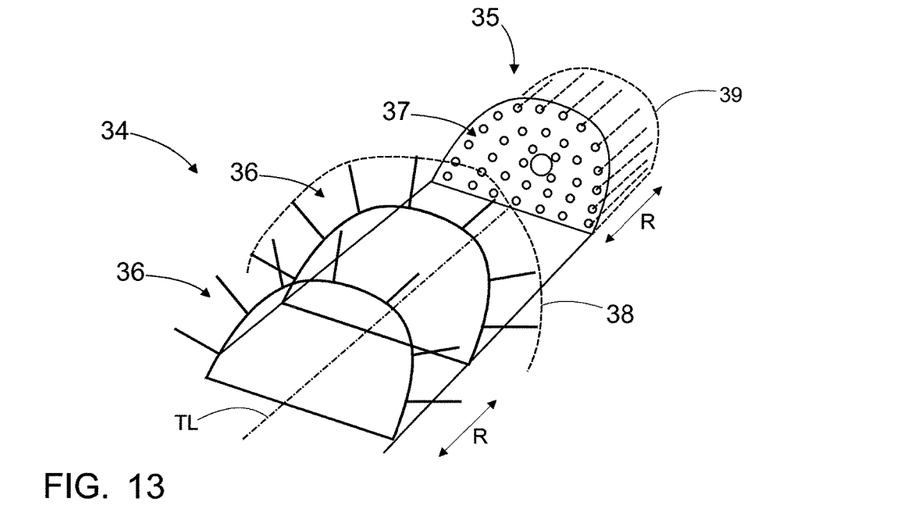
FIG. 13 is a schematic view showing principles of fan drilling and face drilling methods.

FIG. 13 shows principles of a fan drilling 34 and face drilling 35. In the fan drilling a fan drilling pattern 36 defining positions and directions of drill holes is used. In the face drilling a face drilling pattern 37 is used. The drilling patterns 36 and 37 define length of a round R. FIG. 13 also discloses a tunnel line TL, which may be predesigned and input to the mine control unit. Further, inner profile 38, 39 of the tunnel along the tunnel line may also be predetermined. The mine plan may also define a minimum profile and a maximum profile for the desired tunnel portions.

Figure 14:
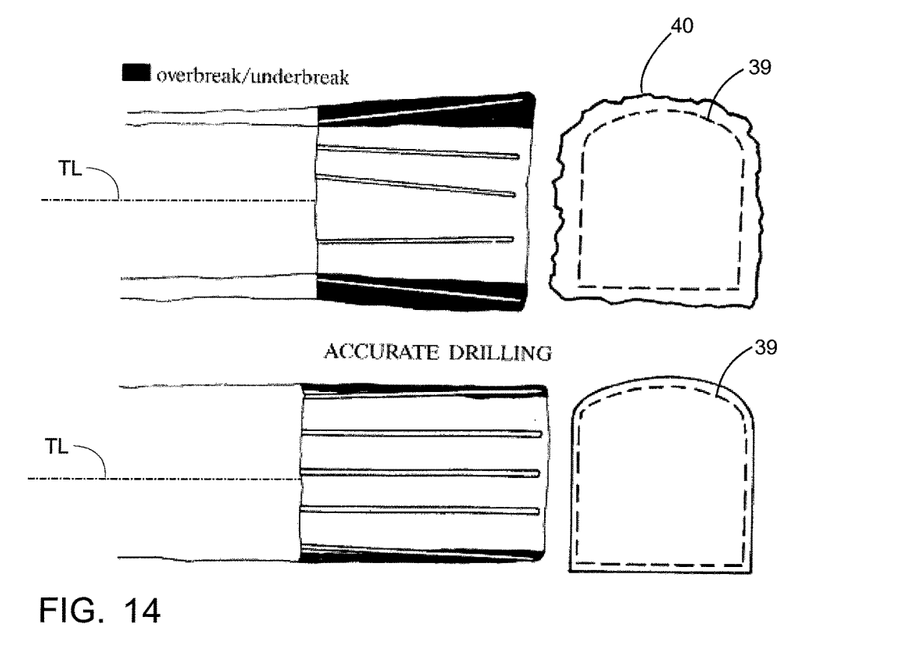
FIG. 14 is a schematic view showing quality problems in tunnel profile caused by inaccurate drilling of blast holes.

FIG. 14 shows some quality problems in tunnel profile caused by inaccurate drilling of blast holes. In an upper part of the FIG. 14 over excavation 40 causes deviations from the planned inner profile and also causes unnecessary excavation work.

The drawings and the related description are only intended to illustrate the idea of the invention. In its details, the invention may vary within the scope of the claims.

The invention claimed is:

1. A mine control system comprising:
   at least one mine control unit connectable via data communication means to several mine vehicles provided with on-board scanning means, wherein the mine control unit is provided with a mine plan including a 3D model of a mine including point cloud data of a mine coordinate system, the mine plan defining development of new rock cavity sections;
   at least one mine vehicle provided with a scanning device, the scanning device being arranged to scan surroundings of the at least one mine vehicle in the mine for producing point cloud data and and determining a position of the at least one mine vehicle in the mine coordinate system, wherein the produced point cloud data is connected to the determined data on position of the scanning in the mine coordinate system, the mine control unit being configured to receive the produced point cloud data from the at least one mine vehicle and compare the received produced point cloud data with the mine plan for determining a current state of the mine relative to the mine plan, and wherein the mine control unit is configured to execute a point cloud matching program arranged to fit the received produced point cloud data to the point cloud data of the 3D model of the mine and update the 3D model of the mine coordinate system on the basis of the received produced point cloud data, and the mine control unit being further configured to receive position data from at least one of the mine vehicles and visualize the position of the at least one of the mine vehicles in the mine on at least one display device, thereby providing updated fleet management data.

2. The mine control system as claimed in claim 1, wherein all of the mine vehicles of the system are provided with the scanning device.

3. The mine control system as claimed in claim 1, wherein the mine control unit is configured to indicate deviations between the mine plan and scanned developed rock surfaces on the basis of the produced cloud point data, the mine control unit being configured to produce data on a quality of an excavation process in at least one section of the mine.

4. The mine control system as claimed in claim 1, wherein the mine plan determines excavation of at least one rock cavity in several successive rounds which are located at a distance from each other along a planned central line of the rock cavity and wherein each round is provided with several drill holes to be drilled on a drilling surface of the round, the at least one mine vehicle being provided with the scanning device being configured to determine realized positions of the rounds and to transmit the determined position data to the mine control unit the mine control unit being configured to determine a realized advance of the excavation of the rock cavity by detecting the position of the recent round.

5. The mine control system as claimed in claim 4, wherein the at least one mine vehicle is further configured to determine a realized profile of the round by the scanning device and is configured to transmit the determined profile to the mine control unit.

6. A mine control unit for controlling several mine vehicles provided with on-board scanning means in a mine, the control unit comprising:
   connection means in operational communication with the several mine vehicles;
   receiving means for receiving scanning data from the several mine vehicles;
   processing means for processing data; and
   a mine plan having a 3D model of the mine, the 3D model including point cloud data in a mine coordinate system, the mine plan defining development of new rock cavity sections, wherein the mine control unit is configured to receive the scanning data from at least one of the mine vehicles, the at least one vehicle having a scanning device for scanning surroundings of the at least one mine vehicle in the mine for producing point cloud data from the scanning data, the at least one vehicle further including means for determining its position in the mine coordinate system, whereby the produced point cloud data is incorporated with the detected data on position of the scanning in the mine coordinate system, and the mine control unit is further configured to compare the received produced point cloud data with the mine plan for determining a current state of the mine relative to the mine plan, execute a point cloud matching program to fit the received produced point cloud data with the point cloud data of the 3D model of the mine, update the 3D model of the mine on the basis of the received produced point cloud data, and receive position data from at least one of the mine vehicles for visualizing the position of the at least one of the mine vehicles in the mine on at least one display device, thereby providing updated fleet management data.

7. A method of controlling several mine vehicles provided with on-board scanning means in a mine, the method comprising:
   providing a mine control unit with a mine plan, the mine plan having a 3D model of the mine including point cloud data of a mine coordinate system, the mine plan defining development of new rock cavity sections;
   receiving, by the mine control unit, scanning data from at least one mine vehicle provided with a scanning device for scanning surroundings of the at least one mine vehicle in the mine for producing point cloud data, the at least one vehicle including means for determining its position in the mine coordinate system, whereby the produced point cloud data is incorporated with the detected data of the scanned position in the mine coordinate system;

comparing, by the mine control unit, the received produced scanning data with the mine plan for determining the current state of the mine relative to the mine plan;

executing a point cloud matching program in the mine control unit to fit the received produced point cloud data into the point cloud data of the 3D model of the mine, wherein the 3D model of the mine is updated on the basis of the produced point cloud data; and receiving, by the mine control unit, position data from at least one of the mine vehicles for visualizing the position of the at least one of the mine vehicles in the mine on at least one display device, thereby providing updated fleet management data.

* * * * *